(12) United States Patent
Martin et al.

(10) Patent No.: US 7,469,398 B2
(45) Date of Patent: Dec. 23, 2008

(54) IP PLACEMENT VALIDATION

(75) Inventors: Gregor J. Martin, Mountain View, CA (US); Ying Chun He, Milpitas, CA (US); Grant Lindberg, Pleasanton, CA (US)

(73) Assignee: LSI Corporation, Milpitas, CA (US)

( * ) Notice: Subject to any disclaimer, the term of this patent is extended or adjusted under 35 U.S.C. 154(b) by 443 days.

(21) Appl. No.: 11/204,670

(22) Filed: Aug. 16, 2005

(65) Prior Publication Data
US 2007/0044059 A1    Feb. 22, 2007

(51) Int. Cl.
*G06F 17/50* (2006.01)
(52) U.S. Cl. .................... 716/10; 716/2; 716/5; 716/11

(58) Field of Classification Search ............... 716/1–2, 716/4–11, 16–18
See application file for complete search history.

(56) References Cited

U.S. PATENT DOCUMENTS

2002/0188910 A1* 12/2002 Zizzo .......................... 716/1
2005/0235244 A1* 10/2005 Byrn et al. ................... 716/18
2006/0193346 A1*  8/2006 McKernan ................. 370/469

* cited by examiner

*Primary Examiner*—Paul Dinh
(74) *Attorney, Agent, or Firm*—Christopher P. Maiorana, PC

(57) ABSTRACT

A method for defining valid placement of intellectual property (IP) blocks within a platform application specific integrated circuit comprising the steps of (A) extracting IP recorded information for an intellectual property (IP) block to be placed on a platform application specific integrated circuit, (B) extracting device data for the platform application specific integrated circuit and (C) determining one or more valid placement locations for the intellectual property (IP) block based upon the IP recorded information and the device data.

17 Claims, 6 Drawing Sheets

IP PLACEMENT VALIDATION

FIELD OF THE INVENTION

The present invention relates to platform (or structured) application specific integrated circuit (platform/structured ASIC) design generally and, more particularly, to IP placement validation.

BACKGROUND OF THE INVENTION

Currently intellectual property (IP) cores (or blocks) are validated against all base platform/structured application specific integrated circuits (ASICs). When a new platform/structured ASIC becomes available, a new validation is performed for all the IP (i.e., the cores have to be hand-placed and the timing of the cores has to be checked). Hand-placing and checking timing are time consuming, tedious and prone to error.

Increasingly, valid placement and timing closure of key IP is becoming a problem for platform/structured ASIC customers. A mechanism to manage the valid placements of IP on any given platform/structured ASIC can be key to ensuring the scalability of a product line. Defining a mechanism for allowing valid placement of firm and hard IP cores may significantly improve the turn around time for designs that use such IP.

SUMMARY OF THE INVENTION

The present invention concerns a method for defining valid placement of intellectual property (IP) blocks within a platform application specific integrated circuit comprising the steps of (A) extracting IP recorded information for an intellectual property (IP) block to be placed on a platform application specific integrated circuit, (B) extracting device data for the platform application specific integrated circuit and (C) determining one or more valid placement locations for the intellectual property (IP) block based upon the IP recorded information and the device data.

The objects, features and advantages of the present invention include providing a method and/or tool for IP placement validation that may (i) define a way to extract valid placement criteria for firm IP and hard IP, (ii) allow valid placement criteria to be recorded with the IP, (iii) define a way to store valid placement criteria for firm IP and hard IP, (iv) define a process for using stored criteria to determine whether IP will fit on a pre-diffused base device, (v) determine locations that are valid for IP placement, and/or (vi) allow valid placement criteria to be specified without knowledge of existing and/or future devices.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

The present invention generally provides for the implementation of a valid placement process for re-usable IP. In one example, the present invention generally provides an improved (or expanded) method of placing firm and hard IP on a platform/structured application specific integrated circuit (ASIC). The present invention generally covers any type of IP. In one embodiment, the present invention generally provides a method for defining and ensuring valid placement of firm and hard IP within platform/structured ASIC designs. The present invention generally also provides a method for extracting and storing 'valid placement criteria' for firm and hard IP. The present invention also may define a way that stored criteria may be used to determine whether the IP can fit on a pre-diffused base device, and if so, which locations are valid.

The present invention generally allows valid placement criteria to be specified without knowledge of existing device resources. The valid placement criteria may be recorded with the IP. The present invention generally implements a valid placement mechanism without requiring additional data for all devices be generated. The present invention also allows IP valid placement information to be valid on all future devices using the same process technology. The present invention allows IP valid placement information to be valid without an exhaustive analysis to identify every possible location on every existing, added or updated device. The present invention generally provides an advantage by avoiding characterization of every piece of IP on every device, existing or future in order to obtain valid placement information.

Figure 1:
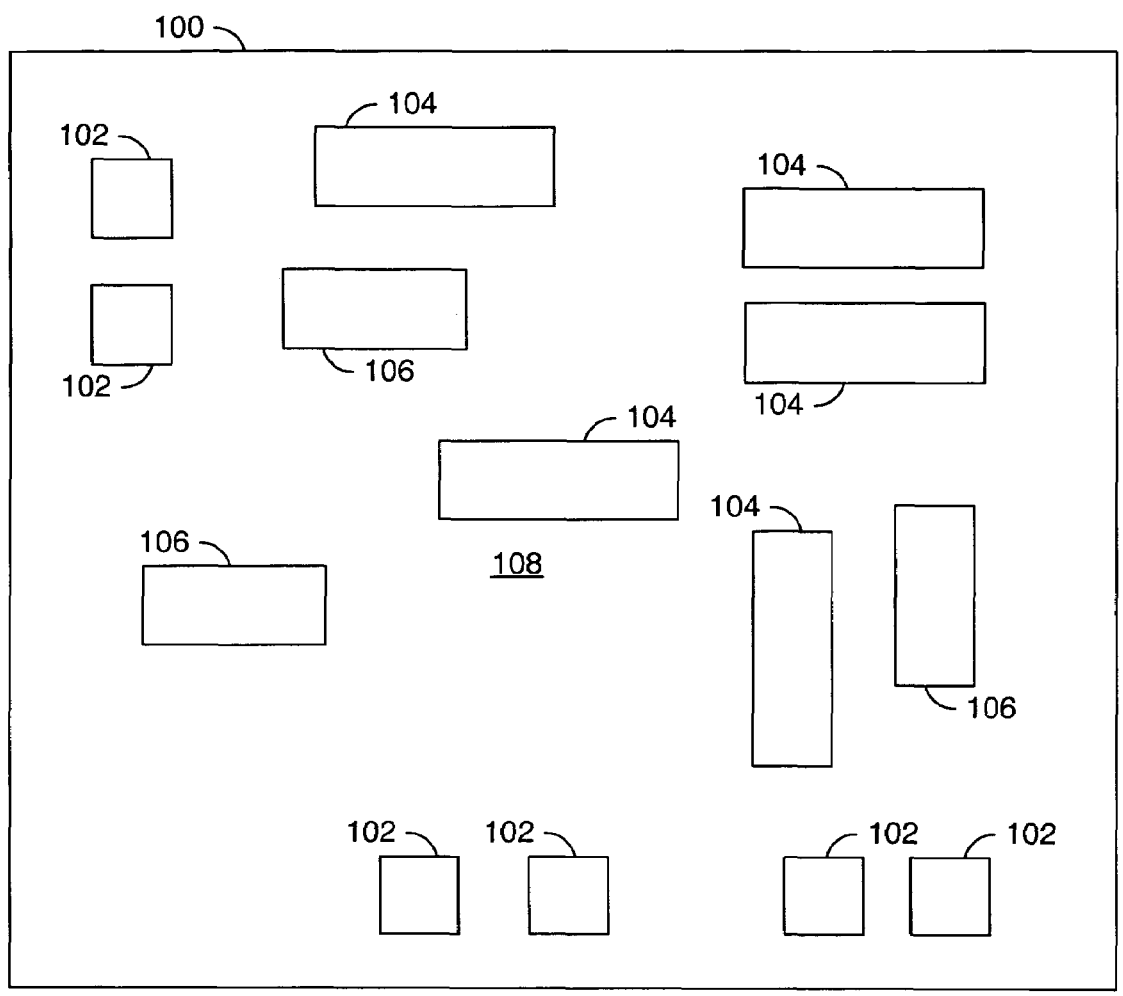
FIG. 1 is a block diagram illustrating a platform application specific integrated circuit (ASIC) in accordance with one or more preferred embodiments of the present invention.

Referring to FIG. 1, a block diagram of a programmable platform device (or die, or chip) 100 is shown in accordance with one or more preferred embodiments of the present invention. In one example, the device 100 may be implemented as a slice. As used herein, the term slice generally refers to a partially manufactured semiconductor device (e.g., a platform or structured application specific integrated circuit) in which the wafer layers up to the connectivity layers have been fabricated. The slice generally comprises a base semiconductor wafer (e.g., from silicon, silicon-on-insulator, silicon germanium, gallium arsenide, other Type II, III, IV, and V semiconductors, etc.). The slice generally comprises a piece of semiconductor material into which blocks or hardmacs have been diffused into the semiconductor layers. Diffusing a semiconductor wafer to create a hardmac simply means that during fabrication of the wafer layers, transistors or other electronic devices have been particularly arranged in the wafer layers to achieve specific functions, such as diffused memory, data transceiver hardware (e.g., I/O PHYs), clock factories (e.g., PLLs, etc.), control I/Os, configurable input/output (I/O) hardmacs, etc. Each of the hardmacs generally has an optimum arrangement and density of transistors to realize a particular function.

The slice may further comprise an area of transistor fabric for further development of the slice (e.g., using a suite of generation tools). The transistor fabric generally comprises an array of prediffused transistors (or R-cells) in a regular pattern that can be logically configured by finalizing one or more metal layers. For example, the R-cells may be personalized (or configured) in subsequent production steps (e.g., by depositing and patterning metal layers) to provide particular logic, storage and/or mixed-signal functions. The logic, storage and/or mixed-signal functions may be further wired together (e.g., a gate array design). Different slices may contain different amounts and arrangements of transistor fabric, different types and amounts of diffused and/or compiled memories, both fixed and configurable I/O blocks, clocks, etc. depending upon the purpose of the final integrated chip.

In one example, the device 100 may comprise a number of pre-diffused regions. For example, the device 100 may comprise one or more regions 102, one or more regions 104, one or more regions 106 and a regions 108. The regions 102 may be implemented, in one example, to support I/O functions. For example, each of the regions 102 may be configured to couple circuitry in a core region of the device 100 to an I/O pin. The regions 104 and 106 may be implemented, in one example, as a memories. In one example, the regions 104 may be implemented as a first type of memory and the regions 106 may be implemented as a second type of memory. The region 108 may be implemented as a customizable region. In one example, multiple regions 108 may be implemented. In one example, the customizable region 108 may comprise a programmable transistor fabric (e.g., a plurality of R-cells). In another example, the customizable region 108 may be implemented as a gate array region. The regions 102, 104 and 106 may be distributed around the device 100.

In one example, the regions 102, 104, 106 and 108 may be used to implement IP blocks similarly to an ASIC design. In general, the IP blocks may be configured to provide a number of functions on (or in) the device 100. For example, the IP blocks may comprise phase locked loop (PLL) blocks (or modules), instances of processor blocks (or modules), input/output physical level (PHY) macro blocks (or modules), and/or any other type of IP block (or module) appropriate to meeting the design criteria of a particular implementation.

The IP blocks may comprise, for example, hard IP, firm IP and/or soft IP. Hard IP generally refers to fully routed and characterized high-performance blocks that may be implemented in a device design. In one example, hard IP may be diffused at optimal locations within a device using cell-based elements for maximum performance and density (e.g., embedded processors, transceivers, etc.). In another example, hard IP may be implemented using the customizable region 108. In general, because the hard IP is fully routed and characterized, the hard IP is not tolerant of variations in position of the resources used to implement the hard IP.

Firm IP generally refers to blocks where cells have been placed, but no routing has been performed. In one example, the firm IP may be implemented using the customizable region 108. In general, the firm IP may be tolerant of variations in position of the resources used to implement the firm IP.

Soft IP may be incorporated into a device as a function block. Soft IP may be implemented similarly to other blocks in a design (e.g., with specific timing criteria to ensure functionality). Soft IP may be implemented, in one example, as Register Transfer Language (RTL) code.

Figure 2:
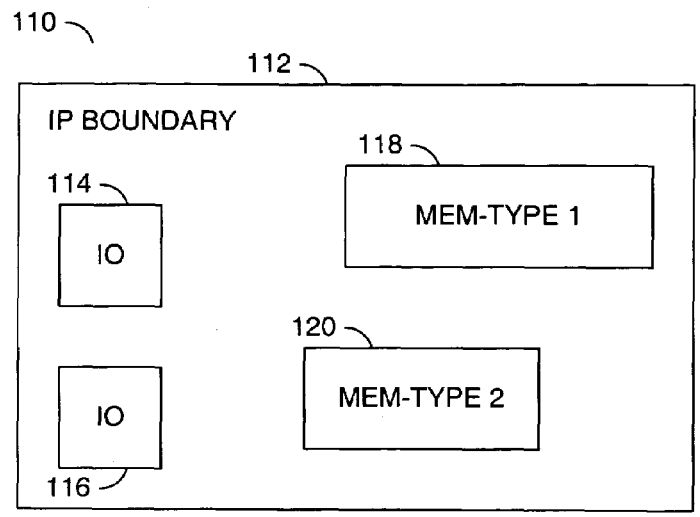
FIG. 2 is a block diagram illustrating an example of a hard IP block.

Referring to FIG. 2, a block diagram is shown illustrating an example of a hard IP block 110. The hard IP block 110 generally comprises a boundary 112 and a plurality of predetermined resources. In one example, the predetermined resources may include an I/O block 114, and I/O block 116, a memory block 118 and a memory block 120. In one example, the memory blocks 118 and 120 may be different types of memories (e.g., diffused, R-cell, pipe-lined, non-pipelined, etc.). In general, information about the hard IP block 110 may include a size and a shape of the IP boundary 112, a list of the exact resources (e.g., I/O blocks memories, R-cells, etc.) used by the hard IP block 110 and a description of the exact placement of the specified resources in relation to the IP boundary 112.

The IP recorded information is generated once the hard IP has reached maturity and is ready for use. The list and placement of diffused IP is recorded, as well as size and aspect ratio of the boundary. In general, for a placement to be valid, the target area contains all the specified IP resources. Once the IP recorded information is generated, the IP recorded information is packaged and delivered with the IP. For example, the IP recorded information may be textual, extensible mark-up language (XML) or any other computer readable and/or executable language, representation, format, or description that may be stored (e.g., electronically, optically, etc.), analyzed and/or manipulated.

Figure 3:
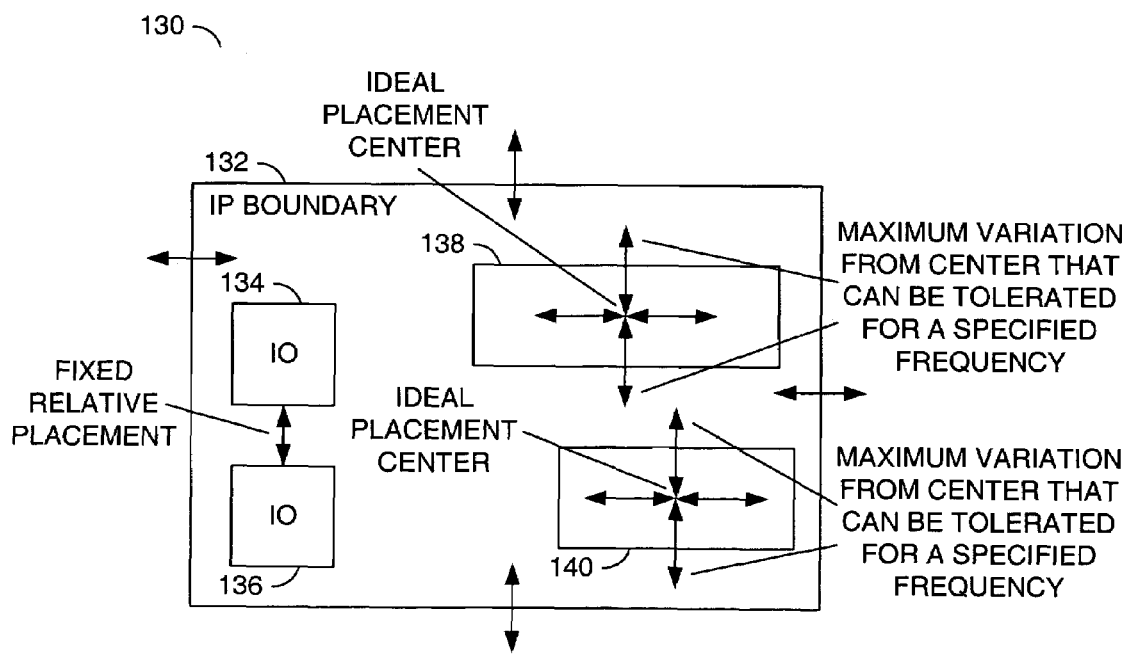
FIG. 3 is a block diagram illustrating an example of a firm IP block.

Referring to FIG. 3, a block diagram is shown illustrating an example of a firm IP block 130. In one example, the firm IP block 130 may comprise an IP boundary 132 and a number of predetermined resources. In one example, the predetermined resources may include an I/O block 134, an I/O block 136, a block 138 and a block 140. In one example, a description of the firm IP block 130 may comprise information including a size and a shape of the IP boundary 132, a list of the exact predetermined resources specified for the IP block 130, information regarding an ideal placement of the predetermined resources and information regarding a minimum and a maximum tolerance of variation in the size and placement of (i) the boundary 132 and/or (ii) each of the one or more predetermined resources 134-140.

In general, the tolerance to variation relates to an amount of variation from an ideal placement that may occur without the IP failing to meet performance specification (e.g., timing, frequency, power, etc.). For example, a potential location that causes the tolerances to be exceeded would not be a valid placement because the IP would no longer meet the specified performance parameters. In one example, the tolerable variation in placement may be determined based upon a desired frequency to be achieved. For example, the I/O block 134 and the I/O block 136 may be described with information concerning a fixed placement relative to each other. The blocks 138 and 140 may be described by information regarding an ideal placement center and information regarding a maximum variation from the center that may be tolerated for a specified frequency.

In general, the IP recorded information is generated once the firm IP has reached maturity and is ready for use. The list and placement of diffused IP is recorded, as well as size and aspect ratio of the boundary. For firm IP, for a given target frequency, there may be some tolerances to the exact relative placement of encompassed diffused IP. In general, for a placement to be valid, the target area contains all the specified IP resources. For firm IP, different tolerances may be calculated for different target frequencies. Once the IP recorded information is generated, the IP recorded information is packaged and delivered with the IP. For example, the IP recorded information may be textual, extensible mark-up language (XML) or any other computer readable and/or executable language, representation, format, or description that may be stored (e.g., electronically, optically, etc.), analyzed and/or manipulated.

In general, a large amount of data may be stored with any IP. The present invention is generally concerned with a subset of the stored data. The present invention generally provides for new types of data to be stored with the IP. For example, the present invention provides for data pertaining to the valid placement of the IP. The information regarding valid placement is generally calculated and stored with the IP. The valid placement data may then be used by the end-user's tools to determine valid locations for the IP within the end-user's floorplan.

Figure 4:
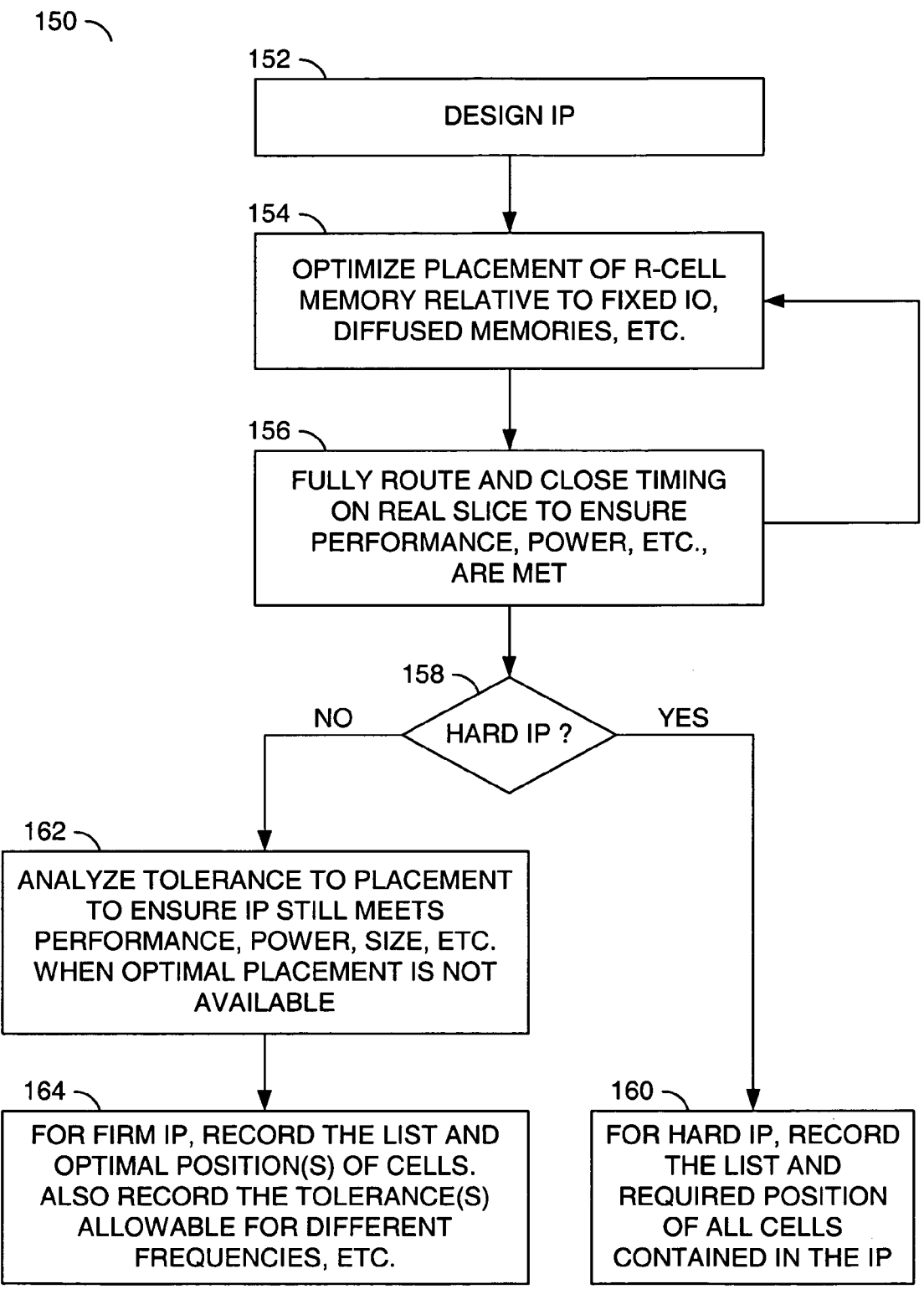
FIG. 4 is a flow diagram illustrating an example of a process for creating hard and firm IP blocks.

Referring to FIG. 4, a flow diagram 150 is shown illustrating any example process for generating hard and firm IP blocks. The process 150 may include a block (or process) 152, a block (or process) 154, a block (or process) 156, a block (or process) 158, a block (or process) 160 and a block (or process) 162. The block 152 may be implemented as an IP design block. The block 154 may be implemented as an IP design optimization block. The block 156 may be implemented as a routing and characterization block. The block 158 may be implemented as decision block configured to receive user input. The block 160 may be implemented as a hard IP generation block. The block 162 may be implemented as a firm IP analysis block. The block 164 may be implemented as a firm IP generation block.

In the block 152, the process 150 may begin with designing a particular IP block. When the IP block design is complete, the process 150 may proceed to the block 154. In the block 154, the placement of particular components and/or elements of the IP design may be optimized. For example, placement of R-cell memories relative to fixed I/O, diffused memories, etc. may be optimized. When the placement has been optimized, the process 150 may proceed to the block 156. In the block 156, the IP block may be fully routed and timing closed on a real device to ensure that performance, power, timing, and other appropriate design considerations are met. If the performance, power and/or other design considerations are not met, the process 150 may return to the optimization process 154. In one example, the blocks 154 and 156 may be implemented as an iterative process.

Once the performance, power and other design considerations are met, the process 150 may proceed to the block 158. In the block 158, the user (or designer) may be queried to select whether the IP is to be a hard IP block or a firm IP block. When the IP is to be a hard IP block, the process 150 may proceed to the block 160. In the block 160, the IP block may be generated as a hard IP block. For example, a list and specific positions for all cells contained within the IP design may be recorded. The description for the hard IP block generally includes the routing layers.

When the IP is to be generated as a firm IP block, the process 150 generally proceeds to the block 162. In the block 162, the IP design is analyzed to determine tolerances to placement of the cells in the IP design. In particular, maximum and minimum tolerances to variation in position may be determined that allow the IP to meet performance, power, size and other design considerations when optimal placement is not available. Following the analysis for placement tolerance, the process 150 moves to the block 164. In the block 164, a list and optimal positions for each of the cells in the IP design may be recorded. Tolerances to variations in the optimal position for different frequencies and other considerations may also be recorded for delivery with the IP.

Figure 5:
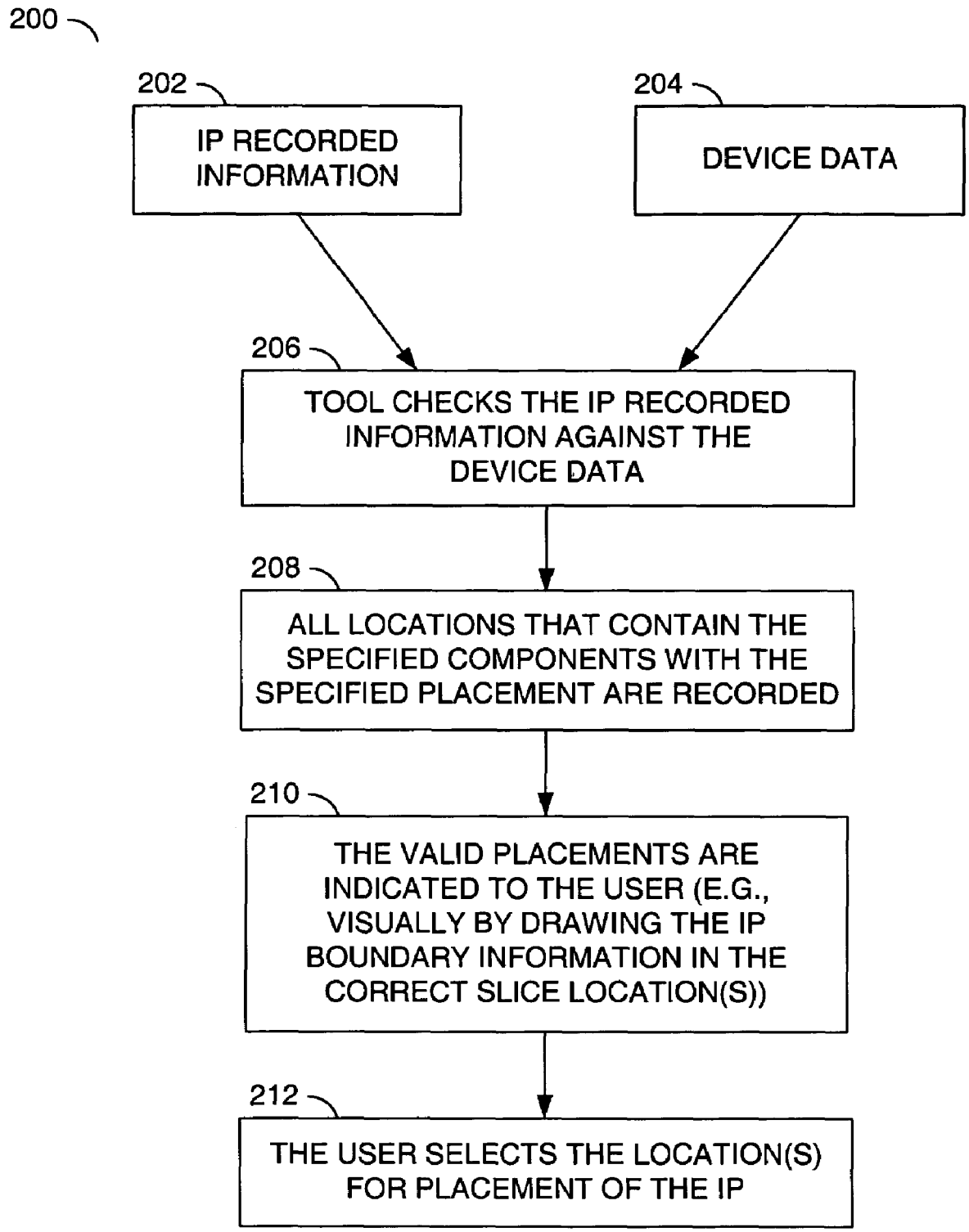
FIG. 5 is a flow diagram illustrating an example of a validation process in accordance with a preferred embodiment of the present invention.

Referring to FIG. 5, a flow diagram is shown illustrating an example design process 200 in accordance with a preferred embodiment of the present invention. In one example, the present invention may involve the use of recorded information concerning a particular IP block in conjunction with information regarding a particular device (or slice). For example, a design tool may be configured in accordance with the present invention to use IP recorded information in conjunction with the device data to determine a valid placement location (or locations) for the corresponding IP. The design tool may be further configured to take into account placement tolerances for firm IP blocks when determining the valid placement locations.

In one example, the process 200 may comprise a block (or process) 202, a block (or process) 204, a block (or process) 206, a block (or process) 208, a block (or process) 210 and a block (or process) 212. In the block 202, the process 200 may begin by collecting (or extracting) recorded information regarding one or more IP blocks. In the block 204, the process 200 may continue by collecting (or extracting) information regarding a particular device to be used as a platform for the IP blocks. For example, device data may be textual, extensible mark-up language (XML) or any other computer readable and/or executable language, representation, format, or description that may be stored (e.g., electronically, optically, etc.), analyzed and/or manipulated. In one example, the blocks 202 and 204 may be implemented as parallel processes.

When the recorded information and device data have been collected, the process 200 generally proceeds to the block 206. In the block 206, the design tool may be configured in accordance with the present invention to check the recorded information concerning the one or more IP blocks against the information regarding the device data to determine locations in the device with the specified components. When the comparison is complete, the process 200 generally proceeds to the block 208.

In the block 208, all of the locations that contain the specified components of the one or more IP blocks with the specified placement may be recorded. When the locations containing the specified components have been recorded, the process 200 generally proceeds to the block 210. In the block 210, the valid placements for the one or more IP blocks may be presented to a user. For example, the valid placements may be shown visually to a user by drawing a boundary representing the IP block information at the valid location(s) on a floorplan diagram representing the particular device (e.g., described below in connection with FIG. 7). The process 200 may be configured to receive input from the designer regarding which locations to use for implementing the design. For example, in the block 212, the user may select a particular valid placement for implementing the respective IP blocks. The selected valid placement may be stored in a design database.

Figure 6:
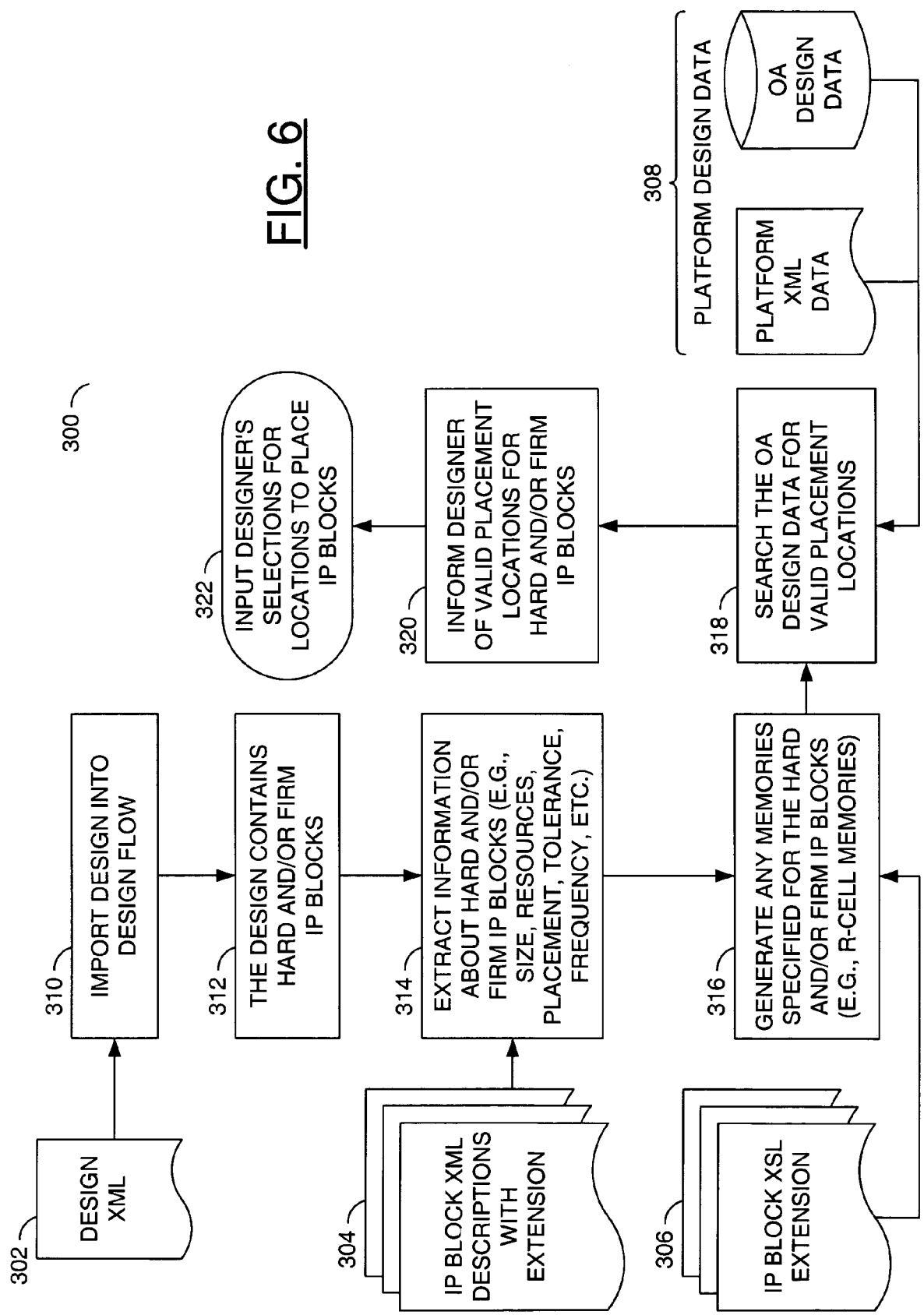
FIG. 6 is a flow diagram illustrating an example of a data flow in accordance with a preferred embodiment of the present invention.

Referring to FIG. 6, a flow diagram is shown illustrating an example design data flow 300 for a design including a hard IP or firm IP instance. In one example, the design data flow 300 may comprise a block 302, a block 304, a block 306, a block 308, a block 310, a block 312, a block 314, a block 316, a block 318, a block 320, a block 322. The block 302 may comprise an extensible mark-up language (XML) description of a design to be implemented using a predetermined programmable platform device (or slice). The block 304 may comprise extensible mark-up language (XML) descriptions (e.g., IP recorded information) for the hard IP and/or firm IP blocks. XML is an industry standard format that may be used for delivering design information. However, other standard and/or proprietary formats may be implemented to meet design criteria of a particular implementation. The block 306 may comprise a memory component extensible stylesheet language (XSL) extension. The block 308 may comprise platform design data for a predetermined programmable platform device (e.g., a platform/structured ASIC).

In one example, the design 302 may include one or more hard or firm IP blocks to be instantiated on (or in) the programmable platform device described by the platform design data 308. In the block 310, the design 302 is generally imported (entered) into the design data flow 300 in accordance with the present invention. In the block 312, the design data may be examined to detect the presence of the hard IP and/or firm IP blocks. In the block 314, the XML descriptions and extensions regarding the hard IP and/or firm IP blocks may be extracted from the component XML description 304. In one example, the component XML description 304 for the hard IP or firm IP block may include a configuration based memory specification. For example, the design flow 300 may determine that the hard IP block and/or firm IP block specifies a memory that uses a diffused memory pattern and that the memory extension is to be generated using XSL based on the configuration.

In the block 316, the memory extension may be generated using the memory component XSL extension from the block 306. The selected memory specification for the hard IP and/or firm IP blocks may be applied to the memory extension data and memory reservations made using a memory tool of the design flow 300. In the block 318, design data for the platform device from the block 308 may be examined to determined whether suitable (or valid) placement locations for the one or more hard IP and/or firm IP blocks detected in the block 312 are available (or present). In the block 320, the valid placement locations detected may be presented to the designer. In the block 322, the designer may enter selections into the design flow selecting the valid placement locations for the hard IP and/or firm IP blocks. In general, the design flow in accordance with the present invention may be implemented with one or more physical design tools or a suite of physical design tools.

Figure 7:
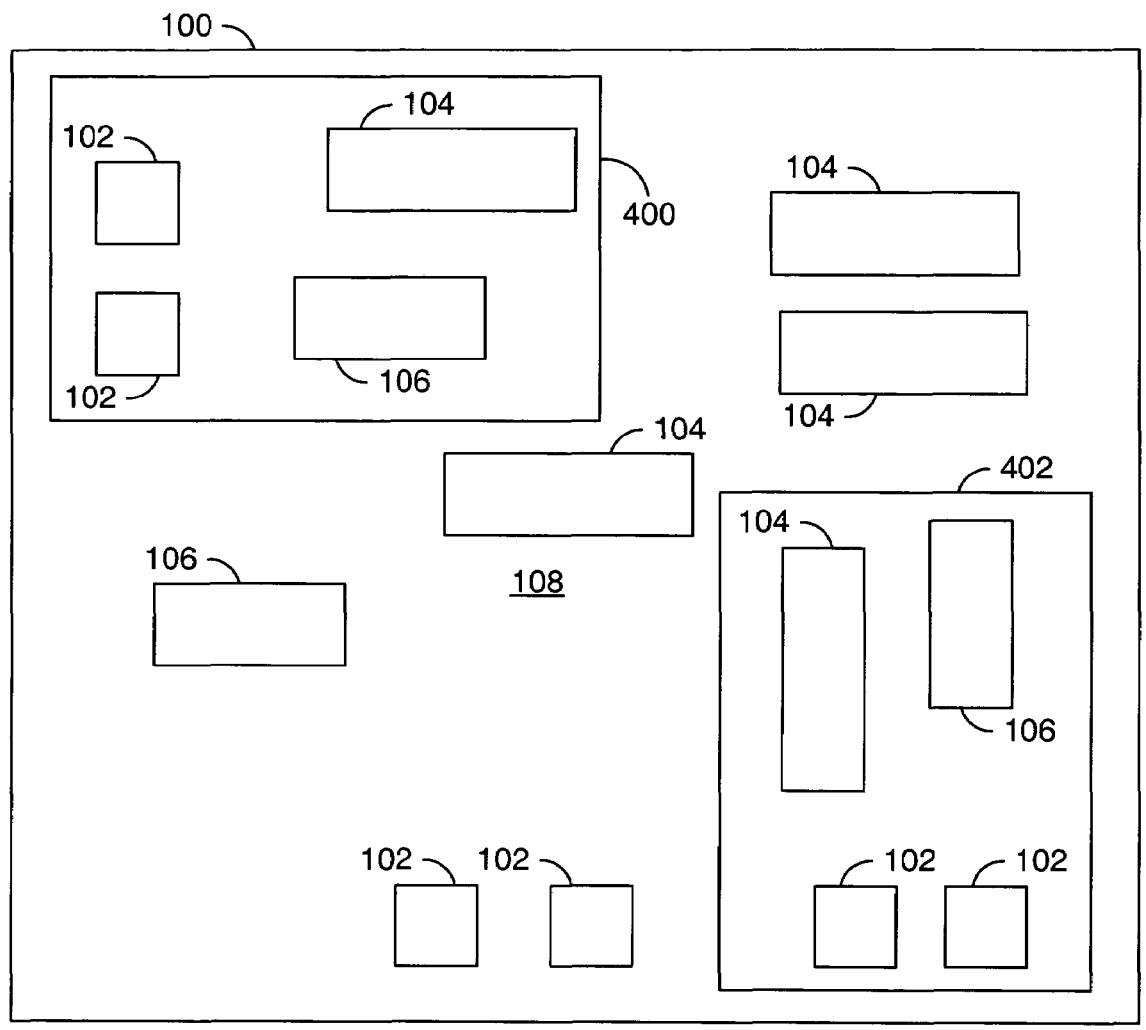
FIG. 7 is a block diagram illustrating an example of a visual indication of valid IP placement sites in accordance with a preferred embodiment of the present invention.

Referring to FIG. 7, a block diagram is shown illustrating an example of a visual indication of valid placement sites in accordance with a preferred embodiment of the present invention. In one example, a layout (or floorplan) of a device may be presented with valid placement sites marked (e.g., overlaid). For example, the layout of the device 100 of FIG. 1 may be present with a boundary 400 indicating a valid site for the hard IP block 110 of FIG. 2 and a boundary 402 indicating a valid site for the firm IP block 130 of FIG. 3. Although a single boundary for each IP block is shown for clarity, boundaries indicating all valid sites for each IP block may be displayed accordingly, as will be apparent to those skilled in the relevant art(s). In one example, each IP block may be displayed individually. In another example, boundaries may be color-coded to distinguish the respective IP block.

The function (or operations) performed by the present invention may be implemented using a conventional general purpose digital computer programmed according to the teachings of the present specification, as will be apparent to those skilled in the relevant art(s). Appropriate software coding can readily be prepared by skilled programmers based on the teachings of the present disclosure, as will also be apparent to those skilled in the relevant art(s).

The present invention may also be implemented by the preparation of application specific integrated circuits (ASICs), application specific standard products (ASSPs), field programmable gate arrays (FPGAs), or by interconnecting an appropriate network of conventional component circuits, as is described herein, modifications of which will be readily apparent to those skilled in the art(s).

The present invention thus may also include a computer product which may be a storage medium including instructions which can be used to program a computer to perform a process in accordance with the present invention. The storage medium can include, but is not limited to, any type of disk including floppy disk, optical disk, CD-ROM, magneto-optical disks, ROMS, RAMs, EPROMs, EEPROMs, Flash memory, magnetic or optical cards, or any type of media suitable for storing electronic instructions.

While the invention has been particularly shown and described with reference to the preferred embodiments thereof, it will be understood by those skilled in the art that various changes in form and details may be made without departing from the spirit and scope of the invention.

The invention claimed is:

1. A method for defining valid placement of intellectual property (IP) blocks within a platform application specific integrated circuit comprising the steps of:
   (A) reading IP recorded information for an intellectual property (IP) block to be placed on a platform application specific integrated circuit, wherein said IP recorded information comprises information regarding a tolerance to variation in one or more parameters of said intellectual property (IP) block, said information regarding said tolerance to variation comprising values defining an amount of variation from an ideal placement with which the IP block still meets a performance specification;
   (B) extracting device data for said platform application specific integrated circuit;
   (C) determining one or more valid placement locations on said platform application specific integrated circuit for said intellectual property (IP) block based upon (i) the values defining the amount of variation from the ideal placement with which the IP block still meets the performance specification included in the IP recorded information and (ii) the device data; and
   (D) displaying a representation of said intellectual property (IP) block overlaid at each of said one or more valid placement location on a floorplan of said platform application specific integrated circuit.

2. The method according to claim 1, further comprising the step of:
   communicating said one or more valid placement locations to a user.

3. The method according to claim 1, further comprising the step of:
   selecting a particular one of the one or more valid placement location in response to information received from a user.

4. The method according to claim 1, wherein said values defining the amount of variation from the ideal placement with which the IP block still meets the performance specification define a range over which specified placement criteria for the IP block can vary and still provide a valid placement.

5. The method according to claim 4, wherein the specified criteria comprise one or more parameters selected from the group consisting of boundary size, boundary shape, diffused resources, and placement of said diffused resources.

6. The method according to claim 5, wherein the values defining the amount of variation from the ideal placement with which the IP block still meets the performance specification comprise maximum and minimum values for said boundary size, said boundary shape, and said placement of said diffused resources.

7. The method according to claim 5, wherein the specified criteria further comprise an operating frequency.

8. The method according to claim 1, wherein the values defining the amount of variation from the ideal placement with which the IP block still meets the performance specification define a range of variation in one or more parameters relating to one or more of (i) a size of a boundary of said IP block, (ii) a placement of a boundary of said IP block, (iii) a size of each of one or more predetermined resources of said IP block and (iv) a placement of each of said one or more predetermined resources of said IP block.

9. A design tool for defining valid placement of intellectual property (IP) blocks within a platform application specific integrated circuit configured to:

read IP recorded information for an intellectual property (IP) block to be placed on a platform application specific integrated circuit from a computer readable medium, wherein said IP recorded information comprises information regarding a tolerance to variation in one or more parameters of said intellectual property (IP) block, said information regarding said tolerance to variation comprising values defining an amount of variation from an ideal placement with which the IP block still meets a performance specification;

read device data for said platform application specific integrated circuit from said computer readable medium;

determine one or more valid placement locations on said platform application specific integrated circuit for said intellectual property (IP) block based upon (i) the values defining the amount of variation from the ideal placement with which the IP block still meets the performance specification included in the IP recorded information and (ii) the device data; and display a representation of said intellectual property (IP) block overlaid at each of said one or more valid placement location on a floorplan of said platform application specific integrated circuit.

10. The design tool according to claim 9, further configured to:

communicate said one or more valid placement locations to a user.

11. The design tool according to claim 10, further configured to:

select a particular one of the one or more valid placement location in response to information received from said user.

12. The design tool according to claim 11, further configured to record said particular valid placement location selected by said user in a database for said platform application specific integrated circuit.

13. The design tool according to claim 9, wherein said values defining the amount of variation from the ideal placement with which the IP block still meets the performance specification define a range over which specified placement criteria for the IP block can vary and still provide a valid placement.

14. The design tool according to claim 13, wherein the specified placement criteria comprise one or more parameters selected from the group consisting of boundary size, boundary shape, diffused resources, and placement of said diffused resources.

15. The design tool according to claim 14, wherein the values defining the amount of variation from the ideal placement with which the IP block still meets the performance specification comprise maximum and minimum values for said boundary size, said boundary shape, and said placement of said diffused resources.

16. The design tool according to claim 14, wherein the specified placement criteria further comprise an operating frequency.

17. The design tool according to claim 9, wherein the values defining the amount of variation from the ideal placement with which the IP block still meets the performance specification define a range of variation in one or more parameters relating to one or more of (i) a size of a boundary of said IP block, (ii) a placement of a boundary of said IP block, (iii) a size of each of one or more predetermined resources of said IP block and (iv) a placement of each of said one or more predetermined resources of said IP block.

* * * * *